United States Patent
Deboy et al.

(10) Patent No.: US 6,870,201 B1
(45) Date of Patent: Mar. 22, 2005

(54) HIGH VOLTAGE RESISTANT EDGE STRUCTURE FOR SEMICONDUCTOR COMPONENTS

(75) Inventors: Gerald Deboy, Unterhaching (DE); Jenoe Tihanyi, Kirchheim (DE); Helmut Strack, Munich (DE); Helmut Gassel, Munich (DE); Jens-Peer Stengl, Grafrath (DE); Hans Weber, Ainring (CH)

(73) Assignee: Infineon Technologies AG, München (DE)

( * ) Notice: Subject to any disclaimer, the term of this patent is extended or adjusted under 35 U.S.C. 154(b) by 0 days.

(21) Appl. No.: 09/530,553

(22) PCT Filed: Nov. 2, 1998

(86) PCT No.: PCT/DE98/03197

§ 371 (c)(1),
(2), (4) Date: Jul. 21, 2000

(87) PCT Pub. No.: WO99/23703

PCT Pub. Date: May 14, 1999

(30) Foreign Application Priority Data

Nov. 3, 1997  (DE) ......................................... 197 48 524

(51) Int. Cl.[7] .............................................. H01L 29/74
(52) U.S. Cl. ........................ 257/170; 257/490; 257/495
(58) Field of Search ................................ 257/487–496, 257/170

(56) References Cited

U.S. PATENT DOCUMENTS

| | | | |
|---|---|---|---|
| 3,405,329 A | | 10/1968 | Loro et al. |
| 4,300,150 A | * | 11/1981 | Colak ......................... 257/336 |
| 4,468,686 A | | 8/1984 | Rosenthal |
| 4,573,066 A | | 2/1986 | Whight |
| 4,609,929 A | * | 9/1986 | Jayaraman et al. ......... 257/336 |

(List continued on next page.)

FOREIGN PATENT DOCUMENTS

| | | | |
|---|---|---|---|
| CA | 667423 | 7/1963 | |
| DE | 44 10 354 | 10/1995 | |
| DE | 196 04 043 | 8/1997 | |
| DE | 19730328 C1 | * 12/1998 | ........... H01L/29/06 |
| JP | 01-272152 | 10/1989 | |
| JP | 02-142184 | 5/1990 | |
| JP | 08-078662 | 3/1996 | |

OTHER PUBLICATIONS

Omura et al., "A breakdown voltage simulator for semiconductor devices with depleted floating regions", NASECODE VI. Proc. 6th Intl. Conf. on Numerical Analysis of Semiconductor Devices and Integrated Circuits, Dublin, IRE, Jul. 11–14, 1989, p. 372–7.*

M. Nagata, et al., "A Planar 2500V 0.3 A Bipolar Transistor for High Voltage Control Circuit", Proc. of 1992 Intl. Symp. on Power Semiconductor Devices and ICs, Tokyo, May 19, 1992, pp. 333–338.

*Primary Examiner*—Paul E. Brock, II
(74) *Attorney, Agent, or Firm*—Schiff Hardin LLP (57) ABSTRACT

The invention relates to a high voltage resistant edge structure in the edge region of a semiconductor component which has floating guard rings of the first conductivity type and inter-ring zones of the second conductivity type which are arranged between the floating guard rings, wherein the conductivities and/or the inter-ring zones are set such that their charge carriers are totally depleted when blocking voltage is applied. The inventive edge structure achieves a modulation of the electrical field both at the surface and in the volume of the semiconductor body. If the inventive edge structure is suitably dimensioned, the field intensity maximum can easily be situated in the depth; that is, in the region of the vertical p-n junction. Thus, a suitable edge construction which permits a "soft" leakage of the electrical field in the volume can always be provided over a wide range of concentrations of p and n doping.

30 Claims, 6 Drawing Sheets

U.S. PATENT DOCUMENTS

| | | | |
|---|---|---|---|
| 4,633,292 A | | 12/1986 | Fellinger et al. |
| 4,750,028 A | | 6/1988 | Ludikhuize |
| 5,028,548 A | * | 7/1991 | Nguyen ............... 148/DIG. 13 |
| 5,032,878 A | * | 7/1991 | Davies et al. ................ 257/491 |
| 5,347,155 A | * | 9/1994 | Ludikhuize .................. 257/489 |
| 5,521,105 A | * | 5/1996 | Hsu et al. ................... 438/197 |
| 5,610,432 A | * | 3/1997 | Ludikhuize .................. 257/212 |
| 5,883,413 A | * | 3/1999 | Ludikhuize .................. 257/343 |
| 5,930,630 A | * | 7/1999 | Hshieh et al. ............... 438/268 |
| 5,969,400 A | * | 10/1999 | Shinohe et al. .............. 257/492 |
| 6,207,994 B1 | * | 3/2001 | Rumennik et al. .......... 257/339 |
| 6,236,068 B1 | * | 5/2001 | Feiler ......................... 257/133 |

* cited by examiner

FIG 5E

HIGH VOLTAGE RESISTANT EDGE STRUCTURE FOR SEMICONDUCTOR COMPONENTS

BACKGROUND OF THE INVENTION

The present invention relates to a high voltage resistant edge structure in the edge region of a semiconductor component.

Accordingly, a high voltage resistant edge structure in the edge region of a semiconductor component is provided, which has a semiconductor body, at whose first surface at least one inner zone of a first conductivity type is adjacent, at least one floating guard ring arranged in the inner zone, and at least one inter-ring zone of a second conductivity type arranged between the floating guard rings.

In semiconductor elements, particularly in high voltage resistant power semiconductor components, voltage breakthroughs preferably arise in their edge region outside the doping zones, since the electrical field intensity is especially great there due to the is curvature of the doping zones which is conditioned by the edge. To avoid such voltage breakthroughs, doping zones are arranged in rings about the semiconductor components. These annular doping zones reduce local field intensity peaks in the edge region of the semiconductor component.

Such protective rings are described in the Canadian patent No. 667,423, for example. But since the field intensity must be reduced to almost zero in each of the guard rings, the floating guard rings described there must be dimensioned very wide toward the edge. This edge structure consumes a great deal of space, accordingly.

Furthermore, U.S. Pat. No. 3,405,329 teaches edge structures of semiconductor components with what are known as magnetoresistive rings. These magnetoresistive rings are constructed so as to achieve a largely uniform voltage distribution along the surface of the semiconductor body of a semiconductor component. In this way, field intensity peaks which favor the occurrence of a breakthrough are avoided. The realization of these magnetoresistive rings in the edge region of the semiconductor component is likewise very costly in terms of space.

U.S. Pat. No. 4,468,686 teaches a high voltage resistant edge structure with magnetoresistive rings and annular doping zones arranged under the magnetoresistive rings. These annular doping zones essentially consist of number of cascaded MOS transistors. The design of this edge structure likewise takes up a large amount of space in the edge region of the semiconductor component.

SUMMARY OF THE INVENTION

Proceeding on the basis of this prior art, it is the object of the present invention to set forth a simple and space-efficient embodiment of a high voltage resistant edge structure for semiconductor components, which further ensures a breakthrough voltage at a reproducible level.

This object is inventively achieved in accordance with the present invention in a high voltage resistant edge structure in an edge region of a semiconductor component, said edge structure comprising:
 a semiconductor body having at least one inner zone of a first conductivity type adjacent to a first surface of said semiconductor body;
 at least one floating guard ring of a second conductivity type arranged in said inner zone; and
 inter-ring zones of said first conductivity type respectively arranged in said inner zone, said inter-ring zones being allocated in pairs to each of said floating guard rings, said inter-ring zones being arranged laterally such that they separate two respective consecutive floating guard rings from one another,
 wherein at least one of said floating guard rings and said inter-ring zones have at least one of conductivities and geometries set such that their free charge carriers are totally depleted when a blocking voltage is applied.

Accordingly, a species-related edge structure is provided, in which the conductivities and/or geometries of the floating guard rings and/or the inter-ring zones are set such that their charge carriers are totally depleted when blocking voltage is applied.

The inventive edge structure achieves a modulation of the electrical field both at the surface and in the volume of the semiconductor. With appropriate dimensioning of the inventive edge structure, the field strength maximum can be easily shifted into the depth of the semiconductor body; that is, into the region of the vertical p-n junction. Thus, there can always be a suitable design for an edge structure over a wide range of concentrations of p and n doping, which design allows a "soft" leakage of the electrical field in the volume.

In a particularly advantageous embodiment of the present invention, the floating guard rings have the same width, whereby the width of the inter-ring zones arranged between the individual floating guard rings increases in the direction of the edge of the semiconductor component.

In a further advantageous embodiment, the width of the floating guard rings decreases in the direction of the edge of the semiconductor component, and the inter-ring zones between the individual floating guard rings have the same width, respectively.

In an embodiment, the depth of the floating guard rings can be varied in the direction of the edge of the semiconductor component. In an embodiment, it is advantageous when the depth of the floating guard rings decreases in the direction of the edge of the semiconductor component.

Accordingly, the remaining design parameters for the inventive edge structure include the widths, spacings, and depths of the floating guard rings, which can be defined using lithographic masks. An optimal edge structure can thus be designed for any semiconductor component, and particularly for an arbitrary range of blocking voltages of semiconductor components, using realistically simple means.

In an embodiment subsection of the floating guard rings advantageously has a trench-shaped cross-section in the shape of a V or U. The V-shaped or U-shaped form of the cross-section, can be produced easily by an isotropic or anisotropic etching process and a subsequent deposition process.

In an embodiment, what is known as a space charge region stopper is also located in the edge region of the semiconductor component. Space charge region stopper refers to an electrode or a heavily doped diffusion zone in the outermost edge region, which defines the lateral extent of the space charge zone beyond the floating guard rings or defines the electrical field. The space charge region stopper usually provides at least a multiple of the breakthrough charge as breakthrough voltage. In an embodiment, as space charge region stopper, a heavily doped zone of the same conductivity type as the epitaxial layer can be provided. In an embodiment, depending on the respective requirements, the space charge region stopper is realized as what is known as a "damage-implanted" region (implantation zone) or as a metal electrode that is shorted to the substrate material of the semiconductor body.

In an embodiment, the inventive edge structure is expediently provided with at least one magnetoresistor in the direction of the edge, which guarantees the component a good electrostatic protection against mobile parasitic charges in its housing. In an embodiment, is has also proven expedient to lead the cathode electrode (in MOSFETs their source electrode), which is situated adjacent the edge structure, up vertically in the direction of the edge region that is, out of the semiconductor body—in order to allow the electrical field to escape from the semiconductor body.

For the overall edge structure, the corresponding design parameters derive from the maximum permissible electrical field and relate essentially to a boundary surface charge that falls safely below the maximum in the region of the vertically extending p-n junctions. In silicon, this maximum boundary surface charge is approx. $1.5 \times 10^{12}$ cm$^{-2}$. Thus, a given doping profile of the semiconductor body in the edge region results in a layout that is rather simple to manage. The shift of the field strength maximum into the region of the transitions between the individual floating guard rings and inter-ring zones arranged between them is achieved by a net excess of acceptor atoms over the entire surface. This means that, over the whole surface, the sum of the implanted dopants in the floating guard rings must exceed the sum of the doping in the intervening inter-ring zones.

Compared to a conventional edge structure, the inventive edge structure can be dimensioned up to 33% smaller in its lateral extent in the direction of the edge of the semiconductor body.

In an embodiment, at least an outermost of the magnetoresistors is nearly completely enclosed by a cathode metallization in a direction of the first surface of the semiconductor component.

In an embodiment, the cathode metallization is a metallization of a source electrode of the semiconductor component.

In an embodiment, the inter-ring zones in the edge region have a cross-section tapered to the first surface.

In an embodiment, the semiconductor component is one of a vertical power transistor or an IGBT.

These and other features of the invention(s) will become clearer with reference to the following detailed description of the presently preferred embodiments and accompanied drawings.

DETAILED DESCRIPTION OF THE PRESENTLY PREFERRED

To the extent that they are not referenced otherwise, elements that are the same or that have the same function are provided with the same reference characters in all Figures of the drawing.

Figure 1:
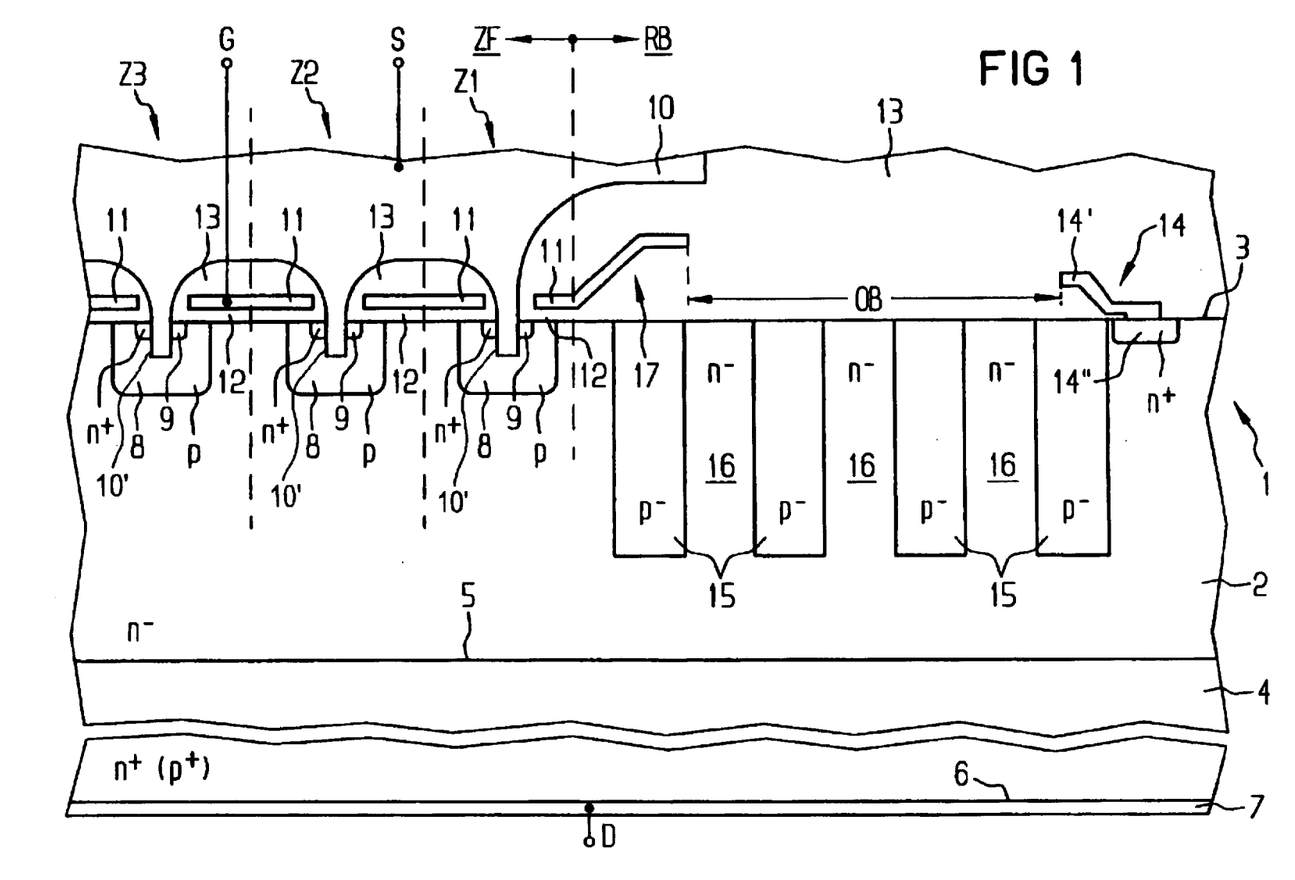
FIG. 1 is a cross-section of a high voltage resistant semiconductor component, which is constructed as a D-MOSFET (or IGBT) here and which comprises an edge structure constructed in accordance with the present invention.

FIG. 1 shows a cross-section of a high voltage resistant (power) semiconductor component comprising an inventive edge structure.

The semiconductor component comprises a cell field ZF having a number of individual components, which are connected in parallel and are arranged in individual cells Z1 . . . Z3, of which the outermost three cells Z1 . . . Z3 are represented as cutouts only. The cell field ZF is terminated by an edge structure that is provided in the edge region RB of the semiconductor component. The edge region RB refers to the region of the semiconductor component located outside its active cells Z1 . . . Z3 of the cell field ZF.

In FIG. 1, the semiconductor body of the semiconductor component is referenced 1. The semiconductor body 1, which consists of silicon substrate, for example, comprises an n-doped inner zone 2 in this embodiment, which is situated adjacent the first surface 3 of the semiconductor body 1 at the source side. The inner zone 2 is typically deposited onto the semiconductor body 1 by an epitaxy process. Particularly in high voltage resistant power semiconductor components having a very high blocking voltage, this epitaxy layer is created with the aid of several consecutive epitaxy steps, wherein a respective epitaxial sublayer is deposited on top of the layer below it. This technique is known as the build-up technique.

At the drain side, a drain zone 4 is adjacent the inner zone 2. If the semiconductor component is constructed as a MOSFET, then the drain zone 4 is typically heavily n-doped. But if the semiconductor component is an IGBT, then the drain zone 4 is also designated as an anode zone and is typically heavily p-doped (represented by brackets in FIG. 1). In this case, the boundary surface 5 characterizes the p-n junction between the drain zone 4 and the inner zone 2. Beyond this, the drain zone 4 is adjacent the second surface 6 of the semiconductor body 1 and is connected here surface-wide to the drain electrode 7 and thus to the drain terminal D.

At the source-side surface 3, a number of base zones 8 are embedded in the inner zone 2. The base zones 8 comprise the opposite conductivity type to the inner zone 2; that is, they are p-doped in the present case. In the present exemplifying embodiment, at least one heavily n-doped source zone 9 is embedded in each of the base zones 8, respectively. In the present exemplifying embodiment, the base zones 8 and the source zones 9 embedded in them have a trough shape and can be created by ion implantation and/or by diffusion, for example.

The base zones 8 and/or the source zones 9 typically, though not necessarily, have the same cell design as the corresponding cells Z1 . . . Z3 in which they are embedded. Such a cell design can consist of cells in the shape of strips, hexagons, triangles, quadrilaterals, circles, ovals, or some such.

The semiconductor component in FIG. 1 is constructed as a vertical D MOSFET (or IGBT). Of course, the source zones 9 or the base zones 8 can also be arranged in what is known as a trench. The corresponding semiconductor component would then be a trench MOSFET or a trench IGBT. It would also be imaginable to give the source zones 9 or the base zones 8 a V-shaped or trapezoidal cross-section.

In FIG. 1, the source zones 9 and the base zones 8 are connected in known fashion to the source electrode 10, and thus to the source terminals S, via contact holes 10'. This shunting of the base zone 8 and the source zone 9 makes it possible to keep a parasitic bipolar transistor from being turned on there.

Beyond this, a gate electrode 11 that is insulated from the semiconductor body 1 via a thin gate oxide 12 is provided at the first surface 3. The gate electrode 11 is connected to the gate terminal G and can consist of heavily doped polysilicon or metal. A field oxide 13 is further provided, which insulates the source electrode 10 from the gate electrode 11 and from the semiconductor body 1.

Finally, the semiconductor component according to FIG. 1 has a space charge zone stopper 14. This space charge zone stopper 14 is arranged at the outermost edge region RB of the semiconductor component; that is, directly before its arris. In the present exemplifying embodiment, the space charge zone stopper 14 is constructed in known fashion as a single-stage metal electrode 14' that rises in the direction of the cell field ZF, which is contacted to a heavily n-doped diffusion zone 14". The metal electrode 14' can also be constructed as a polysilicon electrode, or can be omitted, depending on the application.

Typically, stepped magnetoresistive rings 17 are provided in the edge region Rb of a power semiconductor. Such magnetoresistors 17 are typically single-step or multi-step, these magnetoresistors 17 leading away from the first surface 3 in the direction of the edge. In the exemplifying embodiment according to FIG. 1, only one single-step magnetoresistor 17 is shown.

For reasons of optimizing surface area, it has proven advantageous that the gate electrodes 11 of the respectively outermost cells Z1 of the active cell field ZF simultaneously take over the function of the magnetoresistor 17. It has also proven advantageous that the source electrode 10 adjacent the edge structure is likewise led up vertically in the direction of the edge; that is, is led up from the first surface 3 of the semiconductor body 1. This allows the electrical field to escape from the semiconductor body 1.

Guard rings 15 are inventively provided in the edge region RB; that is, outside the active cell field ZF. These guard rings 15, which are lightly p-doped in this exemplifying embodiment, are "floating"; that is, they have an undefined potential. In the subsection in FIG. 1, these floating guard rings 15 are columnar and extend from the first surface 3 of the semiconductor body 1 to deep in the inner zone 2. In the exemplifying embodiment according to FIG. 1, four of these floating guard rings 15 are provided.

The floating guard rings 15 are spaced apart from one another, and the region between the floating guard rings 15 defines an inter-ring zone 16. This inter-ring zone 16 typically, though not necessarily, has the same dopant concentration as the sub-base doping; that is, as the inner zone 2. The lateral and horizontal dimensions and geometries of the floating guard rings 15 and inter-ring zones 16 and their dopant concentration are not discussed further here. These points are described later with the aid of FIGS. 3 to 5.

The inter-ring ones 16 are typically produced by what is known as the trench technique. In the present exemplifying embodiment, the trenches of the inter-ring zones 16 extend from the first surface 3 of the semiconductor body 1 deep into the inner zone 2. Of course, it would also be possible for these trenches 16 to extend through the entire inner zone 2 and to connect to the drain zone 4. In principle, it is also conceivable for the trenches 16 to penetrate from the first surface 3 to the second surface 6 at the back of the wafer of the semiconductor body. This situation is described later with the aid of FIG. 5.

Figure 2:
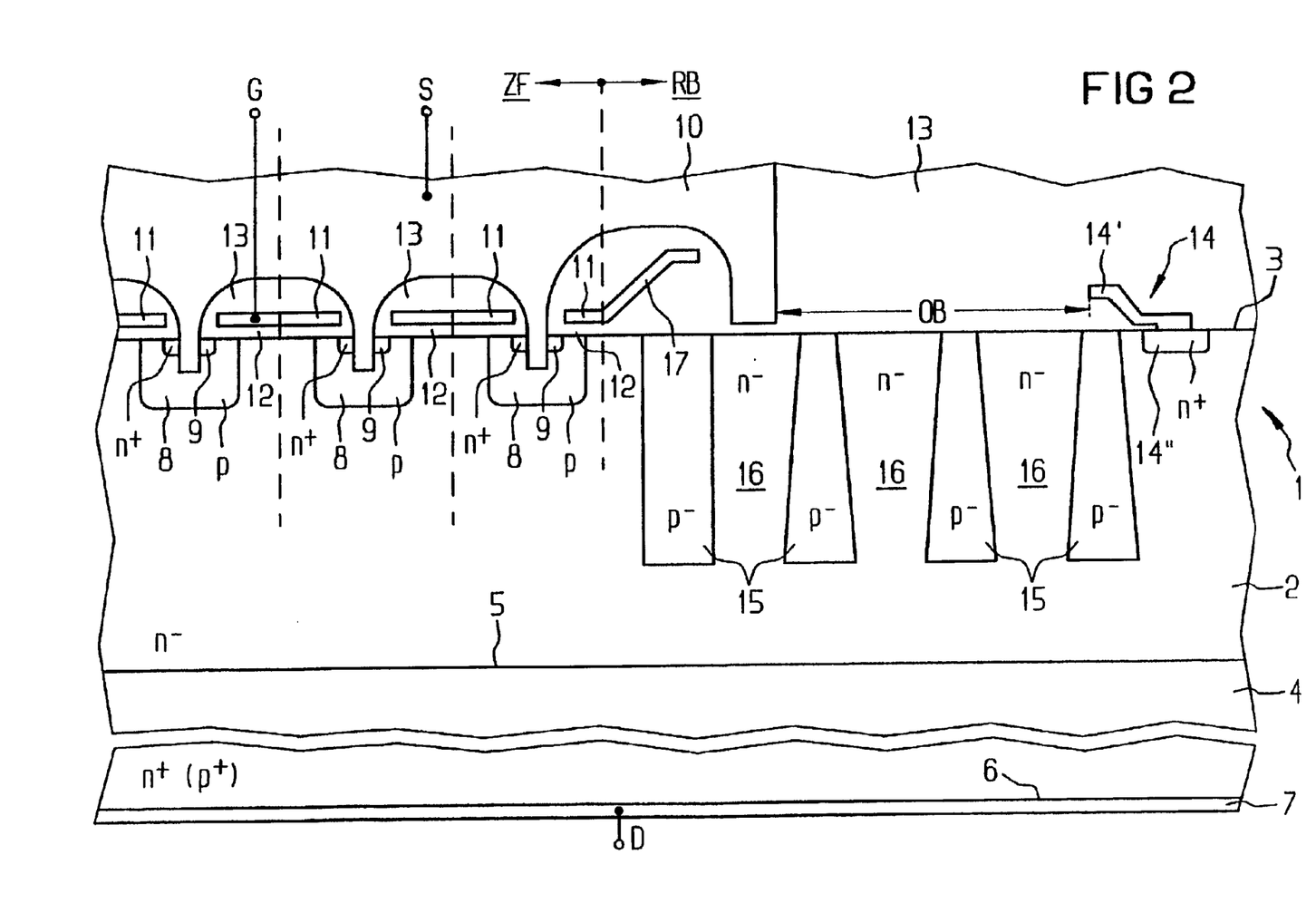
FIG. 2 is a cross-section of a further embodiment of an inventive edge structure constructed in accordance with the present invention.

FIG. 2 illustrates another exemplifying embodiment of an inventive edge structure with reference to a cross-section.

In FIG. 2, the inter-ring zones 16 are additionally tapered in the direction of the first surface 3 of the semiconductor body. Furthermore, it is particularly advantageous when the source electrode 10 encompasses the corresponding gate electrode 11 in the direction of the edge region RB. That is, the source electrode 10 projects in the direction of the edge region RB beyond the corresponding outermost gate electrode 11 the magnetoresistor 17, and is then taken down again in the direction of the first surface 3 of the semiconductor body 1.

The result of this is a structure in the edge structure RB wherein the outermost gate electrode 11 or magnetoresistor 17, is approximately located in a Faraday cage and thus in a nearly field-free space. Compared to the conventional edge structure that is described in FIG. 1, wherein the source electrode 10 is merely drawn up to ever thicker oxide layers of the field oxide 13 in the direction of the edge, the source electrode 10 that encompasses the gate electrode 11 achieves a significant reduction of the electrical field that is directed to the corresponding gate electrode 11.

By virtue of the above described tapering of the annular inter-ring zones 16 to the first surface 3, the electrical field intensity at the end of the metallization of the source electrode 10 can be reduced to below the respective field intensity of the volume. In a complete reversal of the previous design, the metal electrode 14' of the space charge zone stopper 14 in the outermost region of the edge structure can thus be additionally drawn up onto at least one second oxide step of the field oxide 13. In this way, the electrical field distribution in the open area OB of the edge structure—that is, in the region between the space charge zone stopper 14 and the magnetoresistor 17—is so modified that the field lines of the electrical field can emerge from the semiconductor body 1 at the first surface 3 via the entire open area OB nearly unchanged by the respective electrodes 14', 17. In this way, the diffusion zone 14" under the metal electrode 14' an be significantly reduced in the direction of the gate electrode 11 and of cell field ZF. The width of the above cited open area OB between the space charge zone stopper 14 and the outermost cell Z1 of the cell field ZF can thus be significantly reduced, which leads to a considerable reduction of the surface-area of the inventive edge structure and thus of the corresponding semiconductor component.

In FIG. 3, several trench types are shown in cross-section.

Figure 3A:
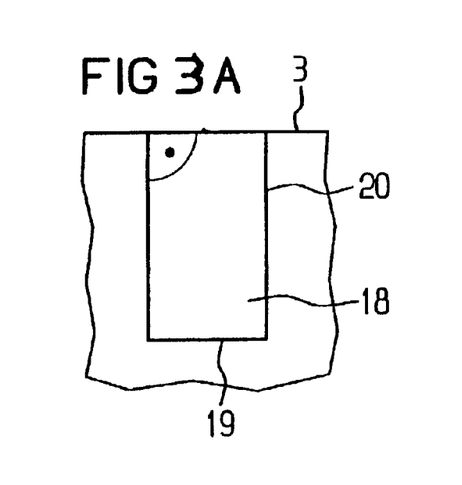
FIG. 3 shows several cross-sections representing various trench types.
Figure 3B:
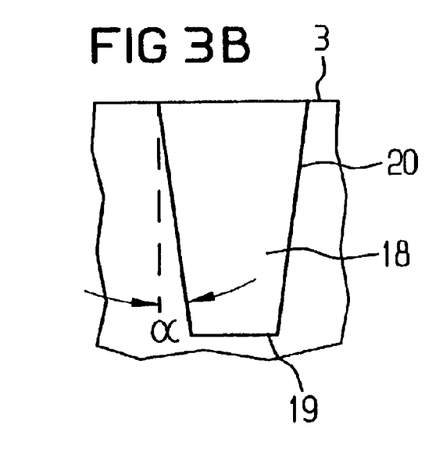
Figure 3C:
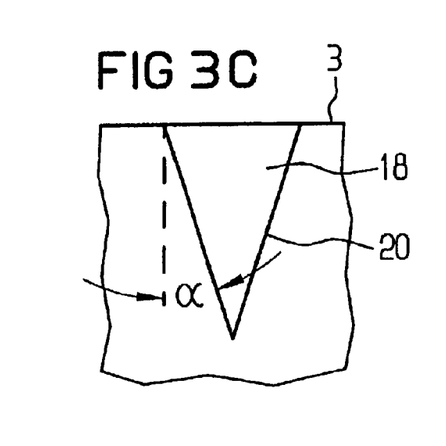
Figure 3D:
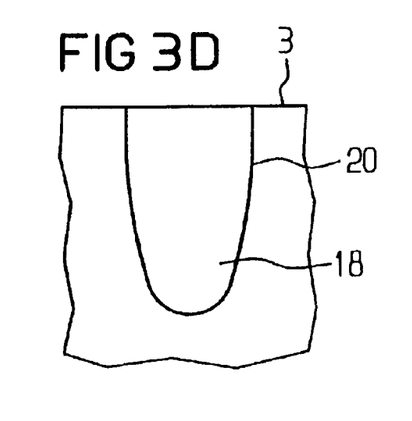

To create the inter-ring zones 16 with the aid of the trench technique, trenches 18 are etched into the inner zone 2 of the semiconductor body 1. In FIG. 1 and FIG. 3(a), these trenches 18 are constructed in an ideally columnar fashion. In the present exemplifying embodiment, the trenches 18 have a bottom 19 that runs approximately parallel to the first surface 3, and walls 20 that are ideally arranged at a right angle to the first surface 3. Typically, however, these walls 20 are angled at a flank angle α relative to the horizontal, forming a trench 18 with an approximately trapezoidal cross-section which tapers into the depth of the semiconductor body 1 (FIG. 3(b)). But this is not absolutely necessary. It would also be conceivable for the trenches 18 to have a cross-section in the form of trenches that are shaped like a V (FIG. 3(c)) or a U (FIG. 3(d)) in embodiment.

A few preferred methods for producing a homogenous doping distribution that can be purposefully adjusted in the edge region of a semiconductor component, and thus for producing an inventive edge structure, are described below with the aid of FIG. 4. In all sub FIGS. 4(a)–(d) only one individual trench 18 is represented, for the sake of providing a better overview.

Figure 4A:
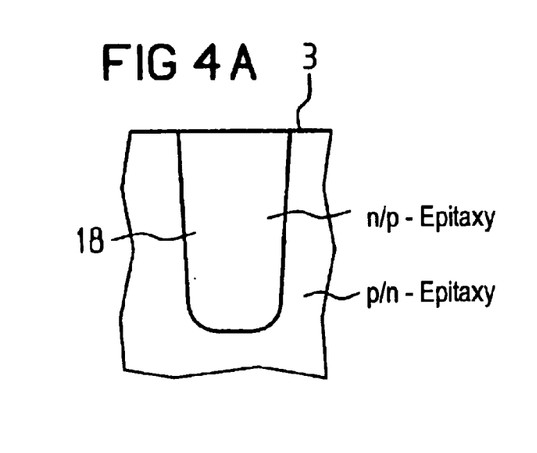
FIG. 4 shows several exemplifying embodiments representing the creation of a homogeneous doping distribution in the edge region of a semiconductor component, which can be purposefully adjusted.

Trenches 18 in the form of points, strips, or grids are etched into a relatively heavily doped base material of a first conductivity type, for instance into the inner zone 2 (FIG. 4(a)). The trenches 18 are epitaxially filled with material of the second conductivity type. Here, the overall charge is set such that a net doping over the whole surface area is approximately zero, and the surface charge does not exceed the breakthrough charge in any spatial direction. A net doping of close to zero means that the number of acceptors (holes) and the number of donators (electrons) in the lateral projection are approximately in balance.

Figure 4B:
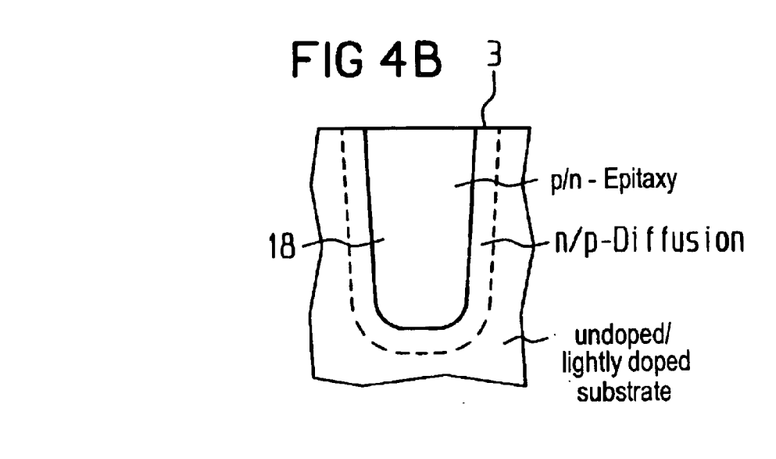

In another embodiment of the present invention, trenches 18 in the form of strips, points, or grids are etched into a lightly doped or undoped base material (FIG. 4(b)). Next, the trenches 18 are covered with epitaxially deposited silicon, polycrystalline silicon or boric phosphorous silicate glass with a doping of the first conductivity type. The doping is driven into the surrounding base material; for instance, by a thermal process. The coating is subsequently etched away again. Next, the trenches 18 are filled again with an epitaxially deposited silicon of the second conductivity type.

Figure 4C:
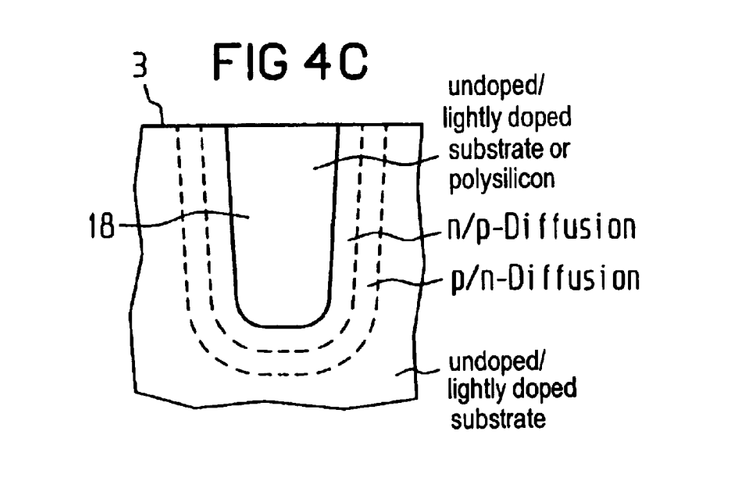

In an advantageous embodiment, it is also possible to drive the doping of the second conductivity type into the surrounding base material via a coating and a subsequent thermal step (FIG. 4(c)). In this case, to achieve a definite separation of the two conductivity zones, dopants with sharply differing diffusion coefficients should be used. The advantage of this procedure is that, given the failure of a trench 18, for instance, due to a particle during the lithography process, the semiconductor component remains fully functional. In the first method cited, on the other hand, this can give rise to a breakdown of the blocking voltage in this region, and thus to the failure of the whole semiconductor component.

Figure 4D:
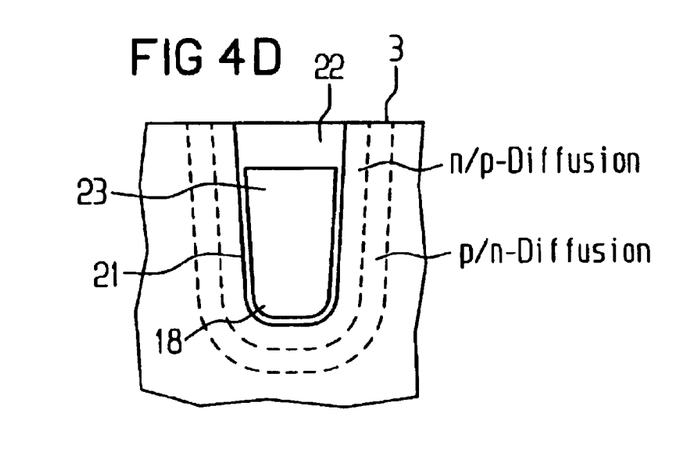

Instead of filling the trenches 18 with epitaxially deposited silicon, a hollow space 23 can remain in the trenches, as long as the walls 20 are covered by a passivation layer 21 and the hollow space 2, 3 is occluded on top by a lid 22, for instance consisting of boric phosphorous silicate glass (BPSG) (FIG. 4(d)).

FIG. 5 shows several subsections, with the aid of which different variants of the edge for setting a purposeful, "softly" leaking doping concentration in the edge region of a semiconductor component are represented. In FIG. 5, for the sake of a better overview, the structures corresponding to the FIGS. 1 and 2 were represented only schematically, since what is essential here is the geometry, the dimensions and the spacings of the trenches 18, particularly in the edge region RB of the semiconductor component.

The trenches 18 can be etched proceeding from the first surface 3, ideally in a self-aligning manner with respect to the actual component processing (for instance, aligned to the polysilicon edge), or proceeding from the back or the second surface 6, after the semiconductor body 1 has been ground thin. Anisotropic etching or isotropic etching can be used. In principle, the trenches 18 may also penetrate from the first surface 3 to the back or the second surface 6 (FIG. 5(a)). If these trenches 18 are doped sufficiently heavily, the relatively expensive epitaxy wafers can be forgone.

Figure 5A:
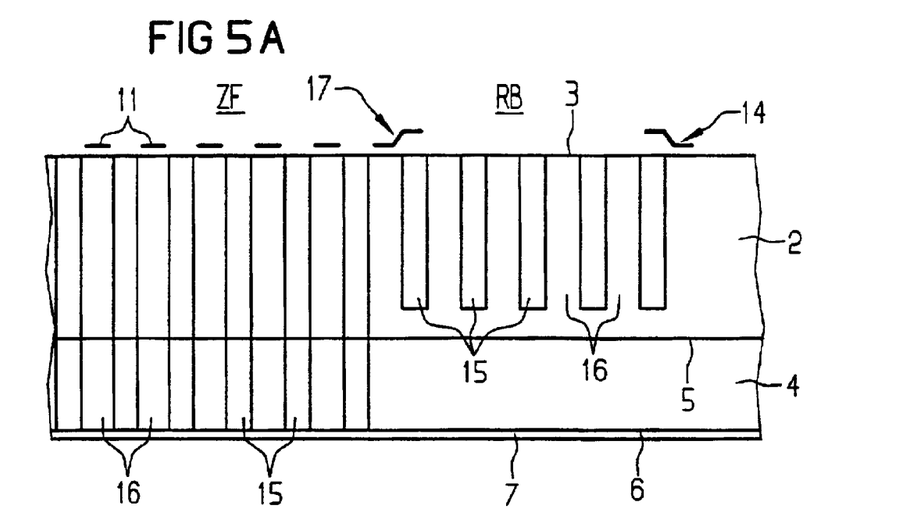
FIG. 5 shows several cross-sections representing various edge variations for adjusting a purposeful, "softly" leaking doping concentration in the edge region of a semiconductor component.

By varying the depth of the trenches 18 in the direction of the edge (FIGS. 5(a) and (c)), it is possible to favorably influence the field intensity distribution in the edge region RB. In FIG. 5(c), the depth t1>t2>t3 of the trenches 18 diminishes continuously in the direction of the edge. In the cell field ZF of the component, the location of the voltage breakthrough can thus be specified.

Figure 5B:
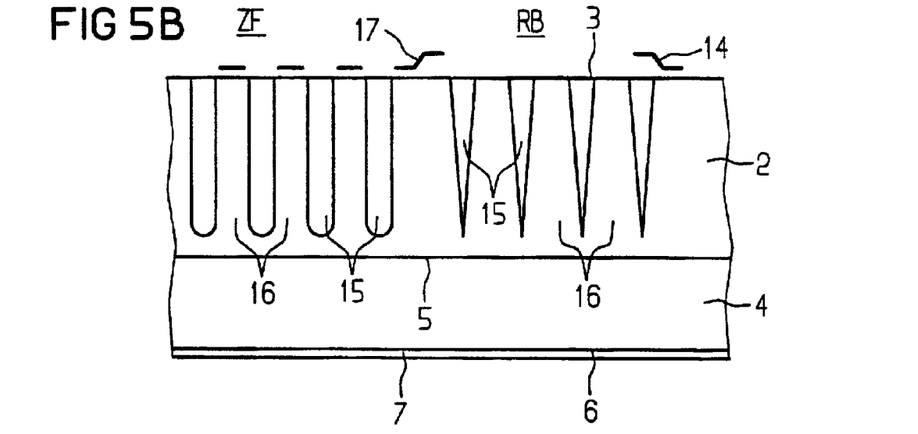
Figure 5C:
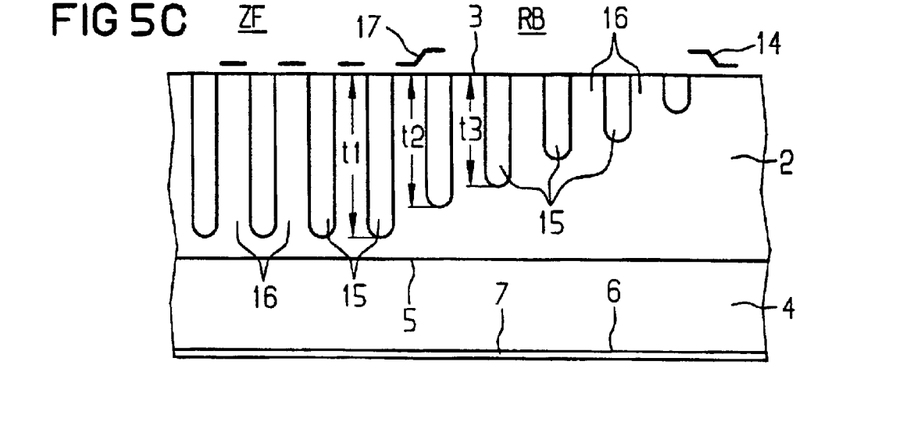

In an embodiment, it is possible to vary the dopant coating of the trenches in the radial or vertical direction (FIG. 5(b)). For example, if trenches 18 with a V-shaped cross-section and an epitaxial filling of these trenches 18 are used, then the shape of the trenches 18 can intentionally be used for vertical variation of the implanted charge proportion. In particular, the flank angle $\alpha$ of the trench walls can also increase in the direction of the edge.

Figure 5D:
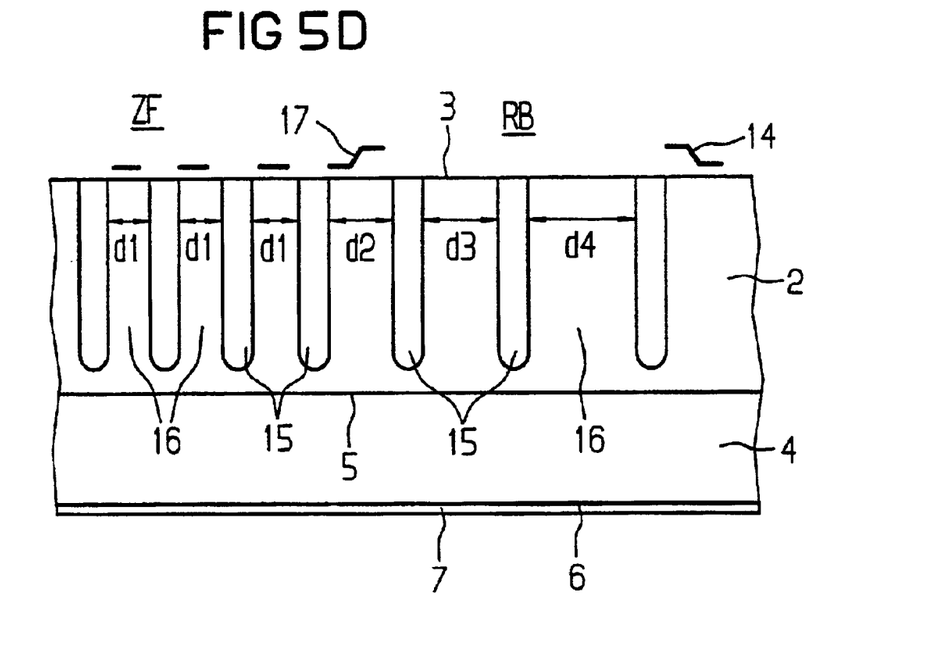
Figure 5E:
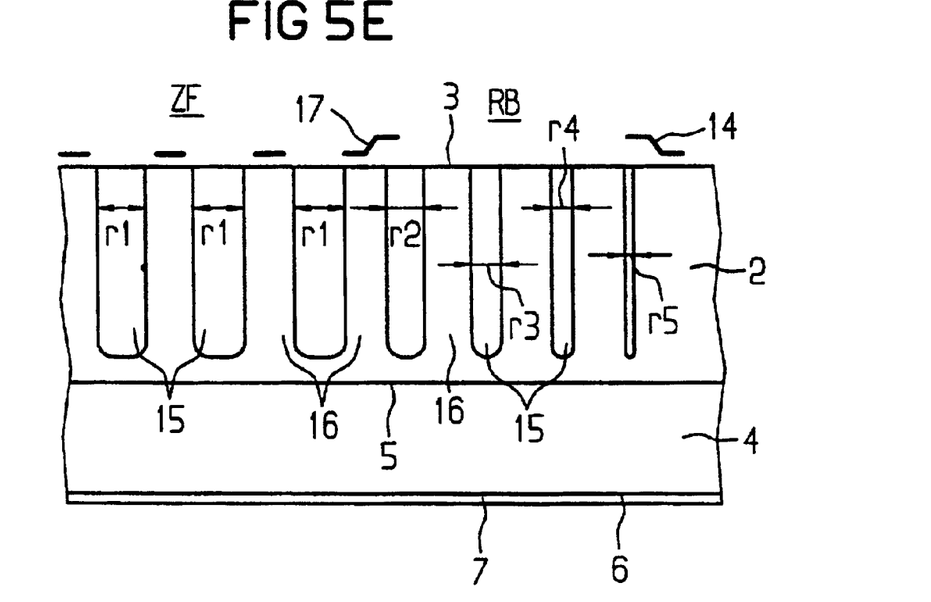

To achieve an optimally gradual transition of the doping from nearly fully compensated to significantly n or p doped, it is possible either to enlarge the grid or the spacings (d1>d2>d3>d4) of two neighboring trenches 18, in the direction of the edge in a gradual manner (FIG. 5(d)), or to reduce the diameter (r1>r2>r3>r4>R5) of the trenches 18 in the direction of the edge (FIG. 5(e)).

Compared to the initially cited build-up technique, the trench technique, as it is referred to, using etched trenches 18 has the advantage that smaller cell grids can be provided. These smaller cell grids can then comprise a heavier doping, thereby reducing the surface make resistance $R_{DS,ON}$ significantly.

By way of conclusion, it should be expressly stated that it is of course possible to apply any of the structures described in the FIGS. 3 to 5 alone or, rather advantageously, in combination with one another, in order to achieve the desired doping profile the desired surfacewide doping distribution, in the edge region RB.

Although modifications and changes may be suggested by those of ordinary skill in the art, it is the intention of the inventors to embody within the patent warranted hereon all changes and modifications as reasonably and properly come within the scope of their contribution to the art.

What is claimed is:

1. A high voltage semiconductor component, comprising:
    a semiconductor body having a high voltage region and having an edge region of said high voltage region, a high voltage resistant structure at said edge region having at least one inner zone of a first conductivity type adjacent to a first surface of said semiconductor body;
    a cell field including a plurality of individual high voltage components in said high voltage region, said high voltage individual components being connected in parallel and arranged in individual cells;
    at least one floating guard ring of a second conductivity type arranged in said inner zone, said at least one floating guard ring surrounding said cell field, said at least one floating guard rind extending deep into said inner zone, said at least one floating guard ring extending into said inner zone to a depth greater than said high voltage individual components; and
    at least one inter-ring zone of said first conductivity type respectively arranged in said inner zone, said at least one inter-ring zone being arranged adjacent said at least one floating guard ring,
    said at least one floating guard ring and said at least one inter-ring zone having respective doping levels such that a net doping level over a whole surface area of said edge region is approximately equal to zero, said at least one floating guard ring and said at least one inter-ring zone have conductivities and geometries set such that their free charge carriers are totally depleted when a blocking voltage is applied.

2. The high voltage semiconductor component as claimed in claim 1, wherein said at least one floating guard ring has one of a U-shaped or V-shaped cross-section.

3. The high voltage semiconductor component as claimed in claim 1, further comprising:
at least one space charge zone stopper located at an outermost edge of said edge region of said semiconductor component.

4. The high voltage semiconductor component as claimed in claim 3, wherein said space charge zone stopper comprises a heavily doped region of said first conductivity type, said heavily doped region being arranged in said inner zone.

5. The high voltage semiconductor component as claimed in claim 3, wherein said space charge zone stopper comprises a damage implanted region being arranged in said inner zone.

6. The high voltage semiconductor component as claimed in claim 3, wherein said space charge zone stopper comprises an electrode connected to said inner zone, said electrode being one of metallic or containing polysilicon.

7. The high voltage semiconductor component as claimed in claim 1, further comprising:
at least one magnetoresistor located at an inner edge of said edge region of said semiconductor component.

8. The high voltage semiconductor component as claimed in claim 7, wherein at least one of said magnetoresistors is simultaneously a gate electrode of said semiconductor component.

9. The high voltage semiconductor component as claimed in claim 7, wherein at least an outermost of said magnetoresistors is nearly completely enclosed by a cathode metallization in a direction of said first surface of said semiconductor component.

10. The high voltage semiconductor component as claimed in claim 9, wherein said cathode metallization is a metallization of a source electrode of said semiconductor component.

11. The high voltage semiconductor component as claimed in claim 1, wherein said at least one inter-ring zone in said edge region has a cross-section tapered to said first surface.

12. The high voltage semiconductor component as claimed in claim 1, wherein said individual high voltage components are one of vertical power transistors and IGBTs.

13. A semiconductor chip, comprising:
a substrate having a major surface;
a field of high voltage semiconductor components defining a high voltage portion in said substrate;
an edge structure at an edge of said high voltage portion, said edge structure separating said high voltage portion of said substrate from an edge of said major surface of said substrate, said edge structure including:
at least one inner zone of a first conductivity type defining a ring structure around said field of high voltage semiconductor components at said major surface;
at least one floating guard ring of a second conductivity type arranged in said at least one inner zone, said at least one floating guard ring extending into said substrate to a depth greater than said high voltage semiconductor components; and
at least one inter-ring zone of said first conductivity type arranged in said at least one inner zone, said at least one inter-ring zone being adjacent to said at least one floating guard ring, at least one of said at least one inter-ring zone and said at least one floating guard ring being of a conductivity and a geometry such that their free charge carriers are totally depleted when a blocking voltage is applied, said at least one inter-ring zone and said at least one floating guard ring having a net doping level over a whole surface area of said major surface of said at least one inner zone.

14. A semiconductor chip, comprising:
a substrate having a major surface;
a plurality of high voltage vertical MOSFET components in said substrate;
an edge structure at an edge of said plurality of high voltage vertical MOSFET components to separate said high voltage vertical MOSFET components from a remainder of said substrate, said edge structure including:
at least one inner zone of a first conductivity type defining a ring structure around said plurality of high voltage semiconductor components at said major surface;
at least one floating guard ring of a second conductivity type arranged in said at least one inner zone, said at least one floating guard ring extending deep into said at least one inner zone, said at least one floating guard ring extending deeper into said substrate than said high voltage vertical MOSFET components; and
an inter-ring zone of said first conductivity type arranged in said at least one inner zone, said inter-ring zone being adjacent to said at least one floating guard ring,
at least one of said inter-ring zone and said at least one floating guard ring being of a conductivity and a geometry such that their free charge carriers are totally depleted when a blocking voltage is applied, said at least one inter-ring zone and said at least one floating guard ring having respective doping levels such that a net doping level over said at least one inner zone is approximately equal to zero.

15. A high voltage semiconductor component as claimed in claim 1, wherein said at least one floating guard ring is a plurality of floating guard rings;
said at least one inter-ring zone is a plurality of inter-ring zones disposed between respective ones of said plurality of floating guard rings;
said plurality of floating guard rings being lightly doped at said second conductivity type;
said plurality of inter-ring zones being lightly doped at said first conductivity type.

16. A high voltage semiconductor component as claimed in claim 1, wherein said at least one floating guard ring is a plurality of floating guard rings;
said at least one inter-ring zone is a plurality of inter-ring zones disposed between respective ones of said plurality of floating guard rings;
said plurality of floating guard rings being doped at said second conductivity type;
said plurality of inter-ring zones being heavily doped at said first conductivity type.

17. A high voltage semiconductor component as claimed in claim 1, further comprising: a layer doped at said second conductivity type between respective ones of said floating guard rings and said inter-ring zones.

18. A high voltage semiconductor component as claimed in claim 1, further comprising: first and second layers between respective ones of said floating guard rings and said inter-ring zones, said first layer being doped at said first conductivity type and said second layer being doped at said second conductivity type.

19. A high voltage semiconductor component as claimed in claim 1, wherein said at least one floating guard ring is a plurality of floating guard rings;

said at least one inter-ring zone is a plurality of inter-ring zones disposed between respective ones of said plurality of floating guard rings;

said plurality of floating guard rings extending into said inner zone of said semiconductor body in substantially parallel columnar cross sections disposed at a regular spacing from one another.

20. A high voltage semiconductor component as claimed in claim 19, wherein each of said plurality of floating guard rings extend to a same depth into said semiconductor body.

21. A semiconductor chip as claimed in claim 13, wherein said at least one floating guard ring is a plurality of floating guard rings;

said at least one inter-ring zone is a plurality of inter-ring zones disposed between respective ones of said plurality of floating guard rings;

said plurality of floating guard rings being lightly doped at said second conductivity type;

said plurality of inter-ring zones being lightly doped at said first conductivity type.

22. A semiconductor chip as claimed in claim 13, wherein said at least one floating guard ring is a plurality of floating guard rings;

said at least one inter-ring zone is a plurality of inter-ring zones disposed between respective ones of said plurality of floating guard rings;

said plurality of floating guard rings being doped at said second conductivity type;

said plurality of inter-ring zones being heavily doped at said first conductivity type.

23. A semiconductor chip as claimed in claim 13, further comprising: a layer doped at said second conductivity type between respective ones of said floating guard rings and said inter-ring zones.

24. A semiconductor chip as claimed in claim 13, further comprising: first and second layers between respective ones of said floating guard rings and said inter-ring zones, said first layer being doped at said first conductivity type and said second layer being doped at said second conductivity type.

25. A high voltage semiconductor component as claimed in claim 1, wherein said at least one floating guard ring extends entirely through said at least one inner zone.

26. A high voltage semiconductor component as claimed in claim 1, wherein said at least one floating guard ring extends entirely through said semiconductor body.

27. A semiconductor chip as claimed in claim 13, wherein said at least one floating guard ring extends entirely through said at least one inner zone.

28. A semiconductor chip as claimed in claim 13, wherein said at least one floating guard ring extends entirely through said substrate.

29. A semiconductor chip as claimed in claim 14, wherein said at least one floating guard ring extends entirely through said at least one inner zone.

30. A semiconductor chip as claimed in claim 14, wherein said at least one floating guard ring extends entirely through said substrate.

* * * * *

UNITED STATES PATENT AND TRADEMARK OFFICE
CERTIFICATE OF CORRECTION

PATENT NO. : 6,870,201 B1
DATED : March 22, 2005
INVENTOR(S) : Gerald Deboy et al.

It is certified that error appears in the above-identified patent and that said Letters Patent is hereby corrected as shown below:

Column 5,
Line 3, after "contact holes 10" insert -- (not shown) --.
Line 46, change "subsection" to -- cross-section --.

Column 6,
Line 13, change "11 the magnetoresistor" to -- II or the magnetoresistor --.
Line 65, change "embodiment" to -- cross-section --.

Signed and Sealed this

Twentieth Day of December, 2005

JON W. DUDAS
*Director of the United States Patent and Trademark Office*